(12) United States Patent
Ding et al.

(10) Patent No.: US 10,566,559 B2
(45) Date of Patent: Feb. 18, 2020

(54) STRUCTURE OF PHOTOVOLTAIC CELL

(71) Applicant: NANOBIT TECH. CO., LTD., Taoyuan (TW)

(72) Inventors: Ding-Kuo Ding, Taoyuan (TW); Yu-Yang Chang, Taoyuan (TW); Shiou-Ming Liu, Taoyuan (TW); Sung-Chien Huang, Taoyuan (TW)

(73) Assignee: NANOBIT TECH. CO., LTD., Taoyuan (TW)

( * ) Notice: Subject to any disclaimer, the term of this patent is extended or adjusted under 35 U.S.C. 154(b) by 0 days.

(21) Appl. No.: 15/832,187

(22) Filed: Dec. 5, 2017

(65) Prior Publication Data

US 2019/0074461 A1 Mar. 7, 2019

(30) Foreign Application Priority Data

Sep. 4, 2017 (TW) .............................. 106213114 U (51) Int. Cl.
| | | |
|---|---|---|
| *H01L 51/44* | (2006.01) | |
| *H01L 51/42* | (2006.01) | |
| *H01L 27/30* | (2006.01) | |
| *H01L 31/04* | (2014.01) | |

(52) U.S. Cl.
CPC .......... *H01L 51/441* (2013.01); *H01L 27/301* (2013.01); *H01L 31/04* (2013.01); *H01L 51/42* (2013.01); *H01L 51/424* (2013.01); *H01L 51/4213* (2013.01); *Y02E 10/549* (2013.01)

(58) Field of Classification Search
CPC ............. H01L 31/0463; H01L 31/0465; H01L 31/046; H01L 31/0224; H01L 31/022433; H01L 51/441–442; H01L 31/042; H01L 31/0445; H01L 31/0475; H01L 51/0014; H01L 51/0021; H01L 51/0023; Y02E 10/549

See application file for complete search history.

(56) References Cited

U.S. PATENT DOCUMENTS

| | | | |
|---|---|---|---|
| 2013/0220412 A1* | 8/2013 | Hatton | H01L 51/0021 136/256 |
| 2015/0221813 A1* | 8/2015 | Kim | H01L 31/0481 438/67 |
| 2016/0208096 A1* | 7/2016 | Sun | C08J 5/18 |
| 2016/0276611 A1* | 9/2016 | Oooka | H01L 51/442 |
| 2016/0293874 A1* | 10/2016 | Oooka | H01L 51/4253 |

* cited by examiner

*Primary Examiner* — Daniel P Malley, Jr.
(74) *Attorney, Agent, or Firm* — Chun-Ming Shih; HDLS IPR Services (57) ABSTRACT

A structure of photovoltaic cell is provided. The structure of photovoltaic cell includes a substrate, a lower conductive layer, a photovoltaic layer, and an upper conductive layer, the lower conductive layer is disposed at one side of the substrate, the photovoltaic layer is disposed at the other surface of the lower conductive layer, and the upper conductive layer is disposed on the other surface of the photovoltaic layer. An electron transporting layer, a hole transporting layer, and an active layer sandwiched between the electron transporting layer and the hole transporting layer collectively constitute the photovoltaic layer. The electron transporting layer covers a portion of the active layer and the hole transporting layer for blocking the upper conductive layer from electrically connecting to the active layer and the hole transporting layer.

9 Claims, 8 Drawing Sheets

STRUCTURE OF PHOTOVOLTAIC CELL

BACKGROUND

Technical Field

The present disclosure relates to a structure of photovoltaic cell. More particularly, the present disclosure relates to an arrangement structure of an electron transporting layer or a hole transporting layer of a photovoltaic cell.

Description of Related Art

A solar cell is one of the most promising renewable energy sources available now. Although most of the commercialized products utilize the silicon as their main material, the solar cells still attract the attention of the industrial and academic fields due to the simple manufacturing procedure, the low manufacturing cost, the light material, and the flexibility.

While manufacturing the photovoltaic solar cell, a membrane of the solar cell is manufactured by coating or evaporation which render the membrane provide with a better flatness and uniformity. The R2R manufacturing process is a potential technique used for manufacturing photovoltaic solar cells with a large area, and the R2R manufacturing process cooperates with an operation in the industrial circles can produce the photovoltaic component with the advantages of plasticity, light weight, and bump-resistance.

Figure 1:
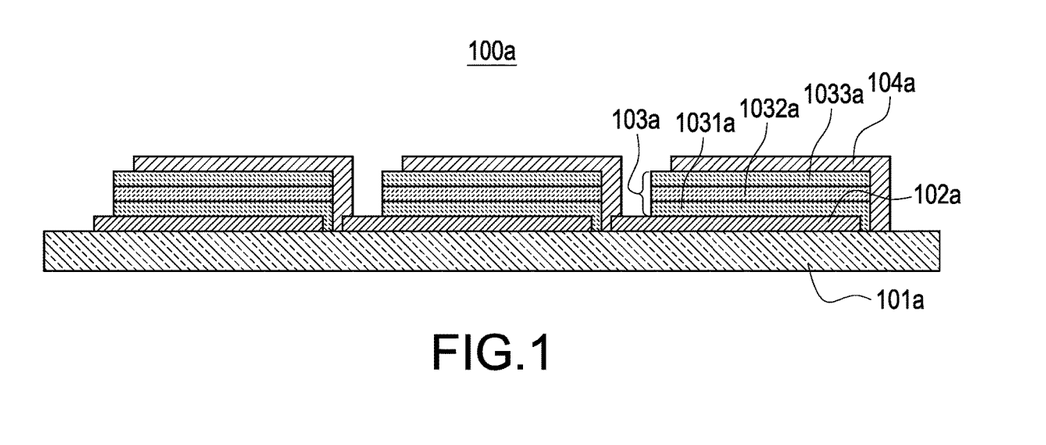
FIG. 1 illustrates an example of a structure of photovoltaic cell in accordance with the related art.

As shown in FIG. 1, the structure of photovoltaic cell of photoelectric conversion element, such as organic photovoltaic cell or Perovskite solar cell, provides photoelectric conversion mechanism by the photovoltaic layer 103a disposed on the substrate 101a and constitutes a circuit loop through an upper conductive layer 104a and lower conductive layer 102a. The photovoltaic layer 103a is constituted by an electron transporting layer 1031a, an active layer 1032a, and a hole transporting layer 1033a, and the effects of photoelectric conversion and electron transportation are achieved by combining the photovoltaic layer 103a with the upper conductive layer 104a and the lower conductive layer 102a. The active layer 1032a may be selected from organic photovoltaic (OPV) materials or Perovskite (PSC) photovoltaic materials. The electron transporting layer 1031a and the hole transporting layer 1033a with different electric characteristics can further enhance the photoelectric conversion efficiency of the active layer 1032a.

The R2R manufacturing procedures processes a high productivity manufacture of the structure of photovoltaic cell; however, the probability of a short circuit in the area between the photovoltaic layer 103a and the upper conductive layer 104a increases due to the lateral side of the photovoltaic layer 103a is partially electrically connected to the upper conductive layer 104a. Even through the thickness of lateral sides of each layer in the photovoltaic layer 103a is smaller than 1 μm, the probability of the short circuit in the area between the photovoltaic layer 103a and the upper conductive layer 104a increases due to the lateral sides of the active layer 1032a and the electron transporting layer 1031a are contacted with the upper conductive layer 104a. Therefore, the present disclosure intends to provide a structure of photovoltaic cell capable of eliminating short-circuit between the photovoltaic layer 103a and the upper conductive layer 104a for enhancing the photoelectric conversion efficiency and meeting the high productivity manufacture of the structure of photovoltaic cell.

SUMMARY

According to one aspect of the present disclosure, the present disclosure discloses a structure of photovoltaic cell, which is advantageous for forming the photovoltaic cell by a continuous roll-to-roll manufacturing process and solving the short-circuit problem due to contact between a lateral side of a photovoltaic layer and an upper conductive layer of the photovoltaic cell.

According to one aspect of the present disclosure, a structure of photovoltaic cell includes at least one hollowed hole formed on the upper conductive layer of each cell to make sure that the cells are light-transmittable.

In view of the above, the structure of photovoltaic cell includes a substrate, a lower conductive layer, a photovoltaic layer, and an upper conductive layer. The lower conductive layer is disposed on one side of the substrate, the photovoltaic layer is disposed at the other surface of the lower conductive layer, the upper conductive layer is disposed on the other surface of the photovoltaic layer; wherein the photovoltaic layer is constituted by an electron transporting layer, a hole transporting layer, and an active layer sandwiched between the electron transporting layer and the hole transporting layer. The electron transporting layer covers a portion of the active layer and the hole transporting layer for blocking the upper conductive layer from electrically connecting to the active layer and the hole transporting layer.

According to another aspect of the present disclosure, the structure of photovoltaic cell includes a substrate, a lower conductive layer, a photovoltaic layer, and a upper conductive layer; the lower conductive layer is disposed on one side of the substrate, the photovoltaic layer is disposed at the other surface of the lower conductive layer, and the upper conductive layer is disposed on the other surface of the photovoltaic layer; the photovoltaic layer is constituted by a hole transporting layer, an electron transporting layer, an active layer that is sandwiched between the electron transporting layer and the hole transporting layer, and the hole transporting layer covers a portion of the active layer and the electron transporting layer for blocking the upper conductive layer and the active layer and the upper conduction layer and the electron transporting layer from electrically connection.

In an embodiment of the present disclosure, the substrate is an optical-transparent plastic substrate or an optical-transparent glass substrate.

In an embodiment of the present disclosure, the structure of photovoltaic cell further includes a hardening layer disposed between the substrate and the lower conductive layer.

In an embodiment of the present disclosure, a thickness of the photovoltaic layer is smaller than 1 μm.

In an embodiment of the present disclosure, the photovoltaic layer is a structure of organic photovoltaic cell that uses multi-layers functional design.

In an embodiment of the present disclosure, the photovoltaic layer is a structure of Perovskite photovoltaic cell that uses multi-layers functional design.

In an embodiment of the present disclosure, a top cover made of transparent material is disposed on the structure of photovoltaic cell and an encapsulation is placed between the top cover and the substrate so that the top cover is glued to the substrate.

In an embodiment of the present disclosure, a top cover is disposed on the structure of photovoltaic cell and a bottom cover is disposed below the structure of photovoltaic cell, and an encapsulation is placed between the top cover and the bottom cover so that the top cover is glued to the bottom cover.

In an embodiment of the present disclosure, the upper conductive layer has at least one hollowed hole.

BRIEF DESCRIPTION OF DRAWING

The present disclosure can be more fully understood by reading the following detailed description of the embodiment, with reference made to the accompanying drawings as follows.

DETAILED DESCRIPTION

A preferred embodiment of the present invention will be described with reference to the drawings.

Figure 2:
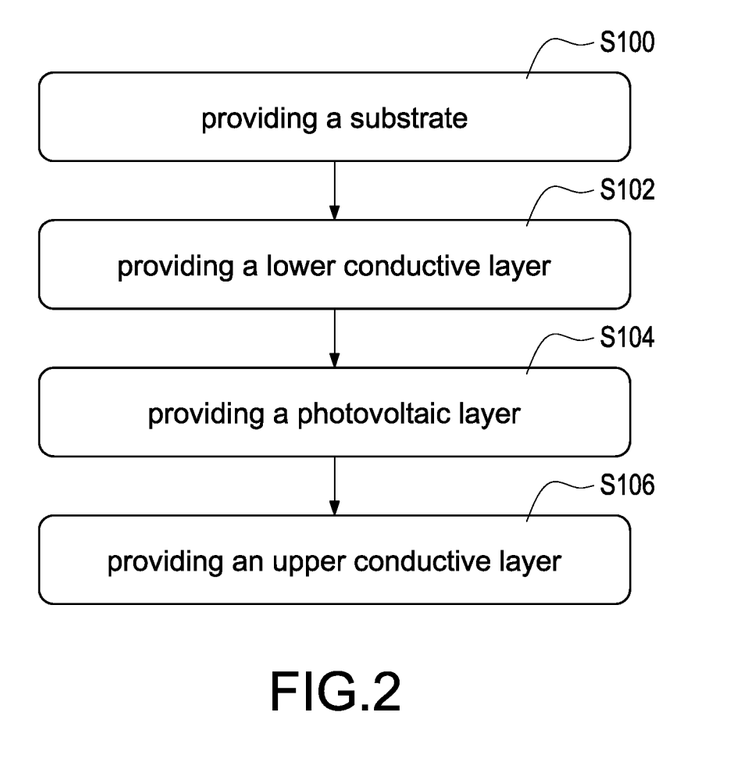
FIG. 2 illustrates a flow chart for fabricating a structure of photovoltaic cell in accordance with a 1st embodiment of the present disclosure.
Figure 3:
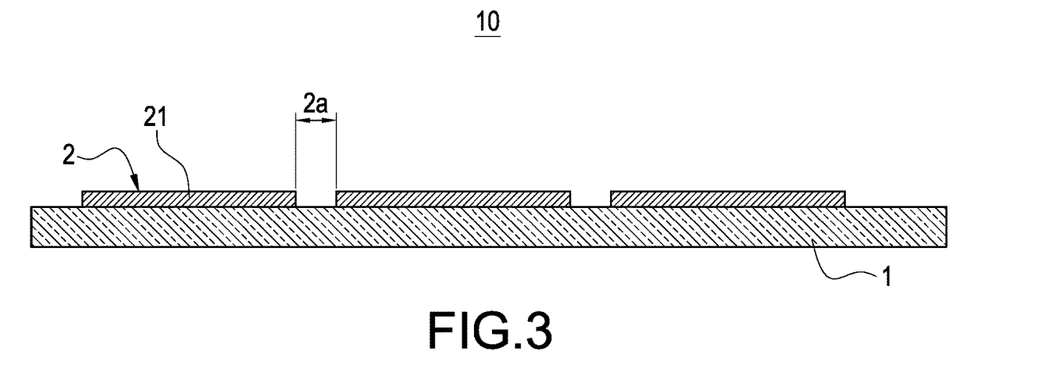
FIG. 3 illustrates a side view that fabricates a lower conductive layer on a structure of photovoltaic cell in accordance with the 1st embodiment of the present disclosure.

FIG. 2 illustrates a flow chart for fabricating a structure of photovoltaic cell in accordance with a 1st embodiment of the present disclosure, and FIG. 3 illustrates a side view that fabricates a lower conductive layer on a structure of photovoltaic cell in accordance with the 1st embodiment of the present disclosure. In FIG. 2 and FIG. 3, the structure of photovoltaic cell includes a plurality of cells arranged in array on a substrate 1, each cell includes a lower conductive layer 2, a photovoltaic layer 3, and am upper conductive layer 4. An electron transporting layer 31 (or the hole transporting layer 33) of the photovoltaic layer 3 covers a portion of an active layer 32 and a portion of the hole transporting layer 33 (or the electron transporting layer 31) thereof for blocking the upper conductive layer 4 from electrically connecting to the active layer 32 and the hole transporting layer 33 (or the electron transporting layer 31).

At first, in step S100, a substrate is provided; the substrate 1 may be an optical-transparent plastic substrate or an optical-transparent glass substrate. The optical-transparent plastic substrate is selected from the group comprising polyethylene terephthalate (PET), polyethylene (PE), poly-imide (PI), nylon, polyamide (PA), polyurethanes (PU), and polymethylmethacrylate (PMMA). Thereafter, a hardening layer (not shown) is provided on a surface of the substrate 1 by executing a curing treatment; the (optical) hardening layer may include PMMA, epoxy, and silicon dioxide, which may be used alone or in combinations thereof. The thickness of the hardening layer is 1 μm-5 μm.

Figure 4:
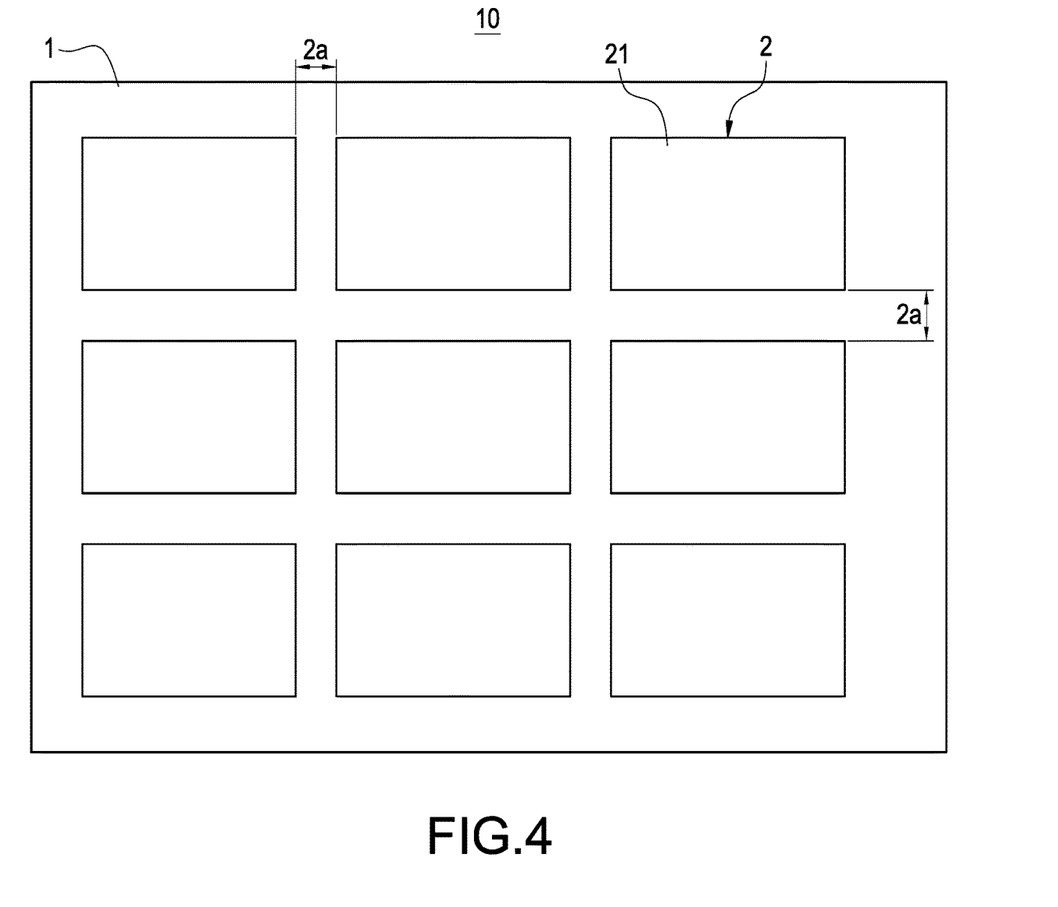
FIG. 4 illustrates a top view of FIG. 3.

In step S102, the lower conductive layer is provided; the lower conductive layer 2 is disposed on a side surface of the hardening layer. The organic or inorganic conductive coating is dry-etched (such as laser etched), wet-etched (such as chemical etched), or evaporated to form a plurality of transparent electrons 21 and circuit(s) (not shown) of the lower conductive layer 2, and the lower conductive layer 2 is disposed on the side surface of the hardening layer. The lower conductive layer 2 may include organic conductive coating and inorganic conductive coating, which may be used alone or in combinations thereof; the organic conductive coating may be metal or metallic oxide, and the inorganic conductive coating may be carbon nanotube, and poly-3, 4-ethylen edioxythiophene (PEDOT), which may be used alone or in combinations thereof. As shown in FIG. 3 and FIG. 4, the width of each first etching trench 2a formed between two adjacent electrodes 21 is 25 μm-100 μm.

Figure 5:
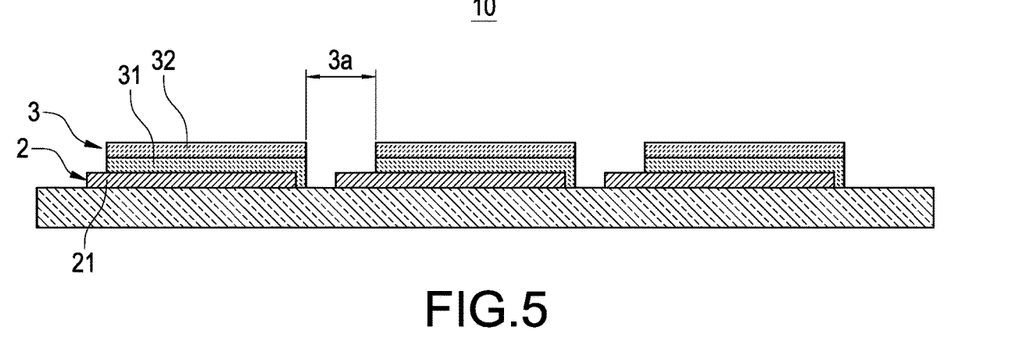
FIG. 5 illustrates a side view that fabricates an electron transporting layer and an active layer on the lower conductive layer of FIG. 3.
Figure 6:
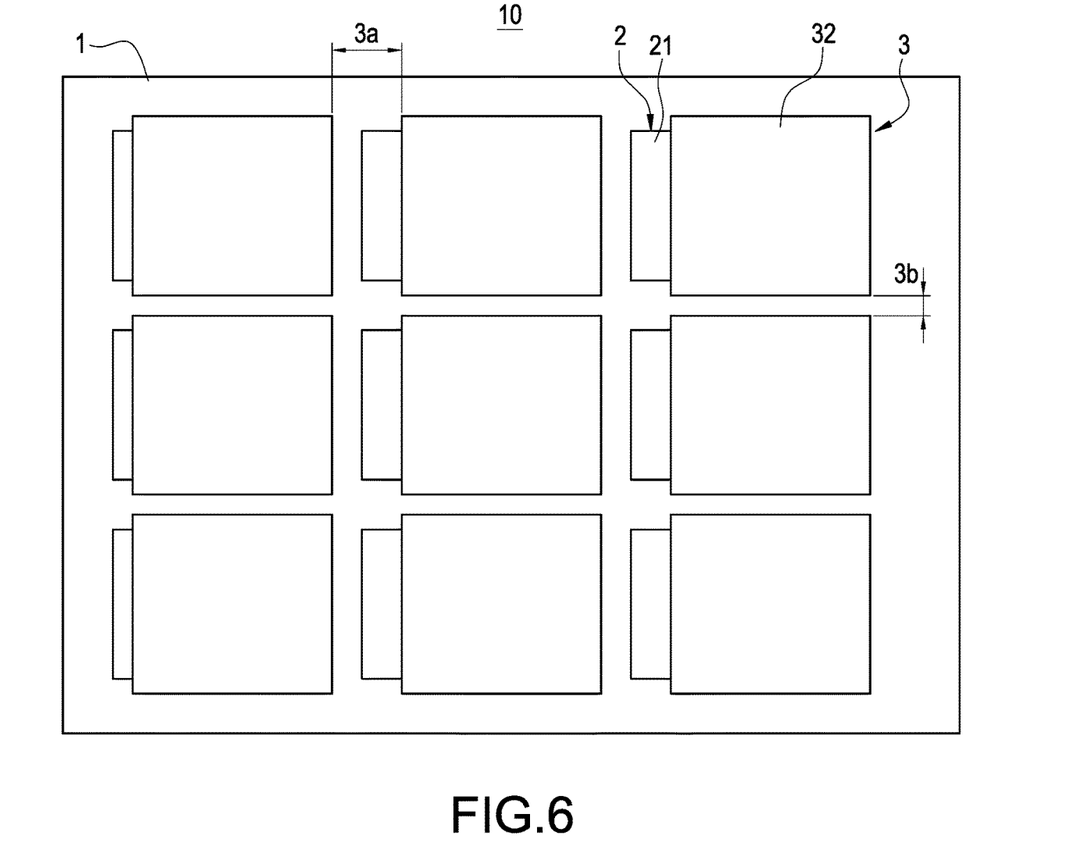
FIG. 6 illustrates a top view of FIG. 5.
Figure 7:
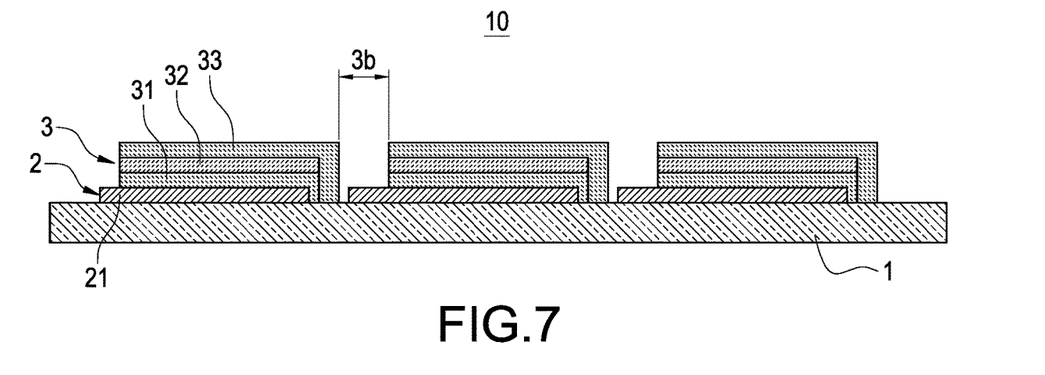
FIG. 7 illustrates a side view that fabricates a hole transporting layer on the active layer of FIG. 6.
Figure 8:
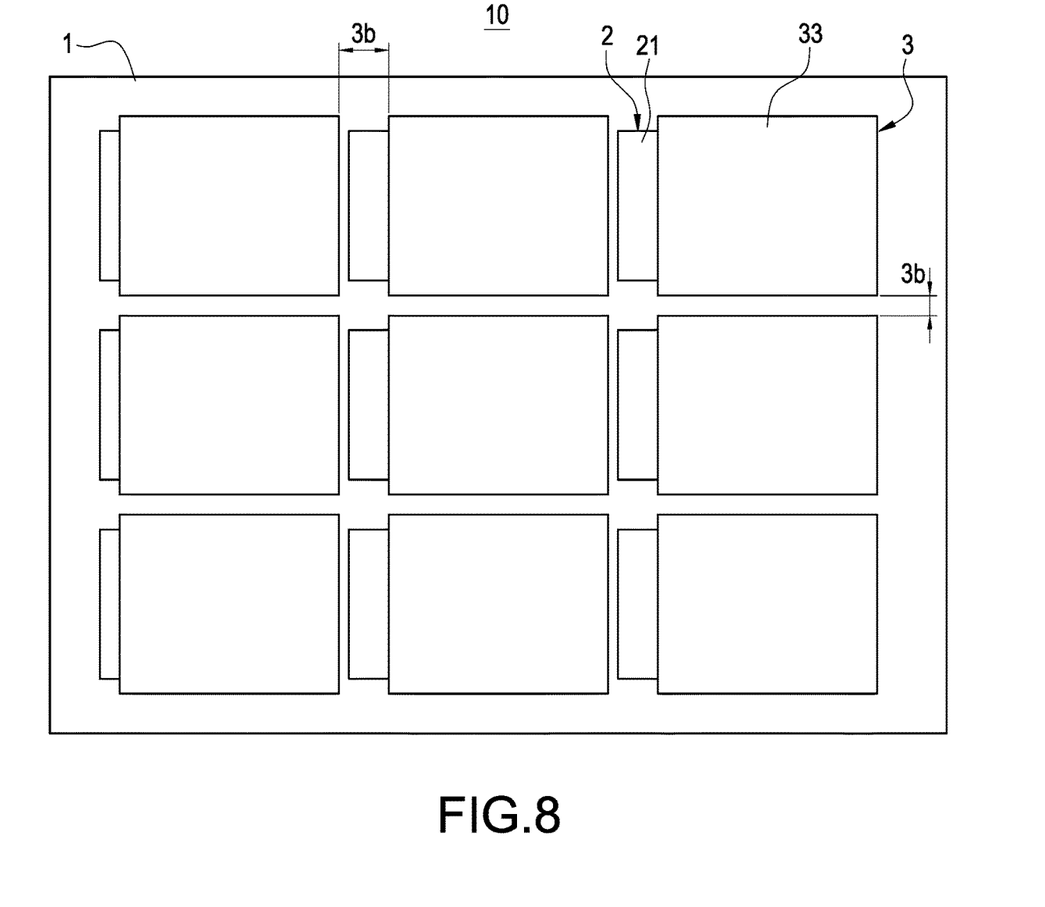
FIG. 8 illustrates a top view of FIG. 7.

In step S104, the photovoltaic layer 2 is provided; the photovoltaic layer 2 is formed on each electrode 21 of the lower conductive layer 3 by slot die coating, evaporation, or screen printing. More particularly, each electrode 21 of the lower conductive layer 2 is sequentially coated with the electron transporting layer 31 and the active layer 32 (or each electrode 21 of the lower conductive layer 2 may be sequentially coated with the hole transporting layer 33 and the active layer 32) which are then dried and etched (as shown in FIG. 5 and FIG. 6). The width of each second etching trench 3a formed between two adjacent cells 3 is 50 μm-100 μm. A coating step is then provided for forming the hole transporting layer 33 (or the electron transporting layer 31) to shield the lateral sides of the electron transporting layer 31 and the active layer 32 (or shield the lateral sides of the hole transporting layer 33 and the active layer 32), so as to block the electron transporting layer 31 and the active layer 32 (or block the hole transporting layer and the active layer 32) from electrically connecting to the upper conductive layer (not shown) for sequent processing. The hole transporting layer 33 (or the electron transporting layer 31) may be formed by slot die coating, evaporation, or screen printing, and is then dried and etched. The width of each third etching trench 3b formed between two adjacent hole transporting layer 33 (or the electron transporting layer 31) of each cell 3 is 25 μm-100 μm (as shown in FIG. 7 and FIG. 8). the photovoltaic layer 3 is a structure of organic photovoltaic cell that uses multi-layers functional design or a structure of Perovskite photovoltaic cell that uses multi-layers functional design. In this embodiment, the thickness of the photovoltaic layer 3 is smaller than 1 μm.

Figure 9:
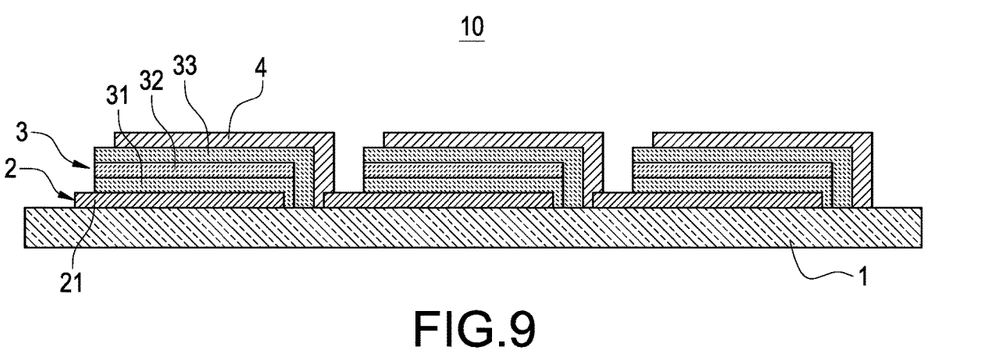
FIG. 9 illustrates a side view that fabricates an upper conductive layer on the hole transporting layer of FIG. 8.
Figure 10:
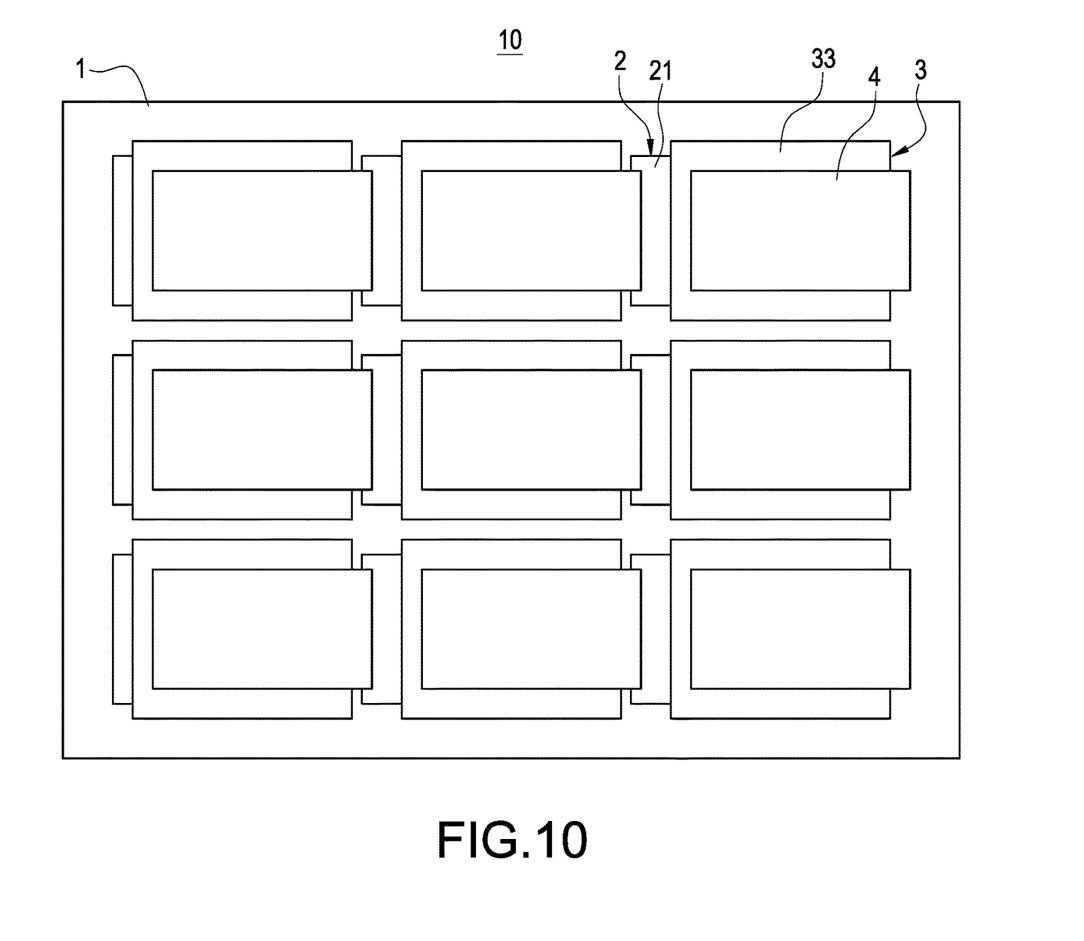
FIG. 10 illustrates a top view of FIG. 9.

In step S106, the upper conductive layer 4 is provided. The conductive coating, such as silver paste, is coated with the hole transporting layer 33 (or the electron transporting layer 31) of each photovoltaic layer 3 and covers the lower conductive layer 2 of the next photovoltaic layer 3, such that the upper conductive layer 3 is electrically connected to the lower conductive layer 2 (as shown in FIG. 9 and FIG. 10). It should be noted that the conductive wire for external connection may be formed when fabricating the upper conductive layer 4.

Figure 11:
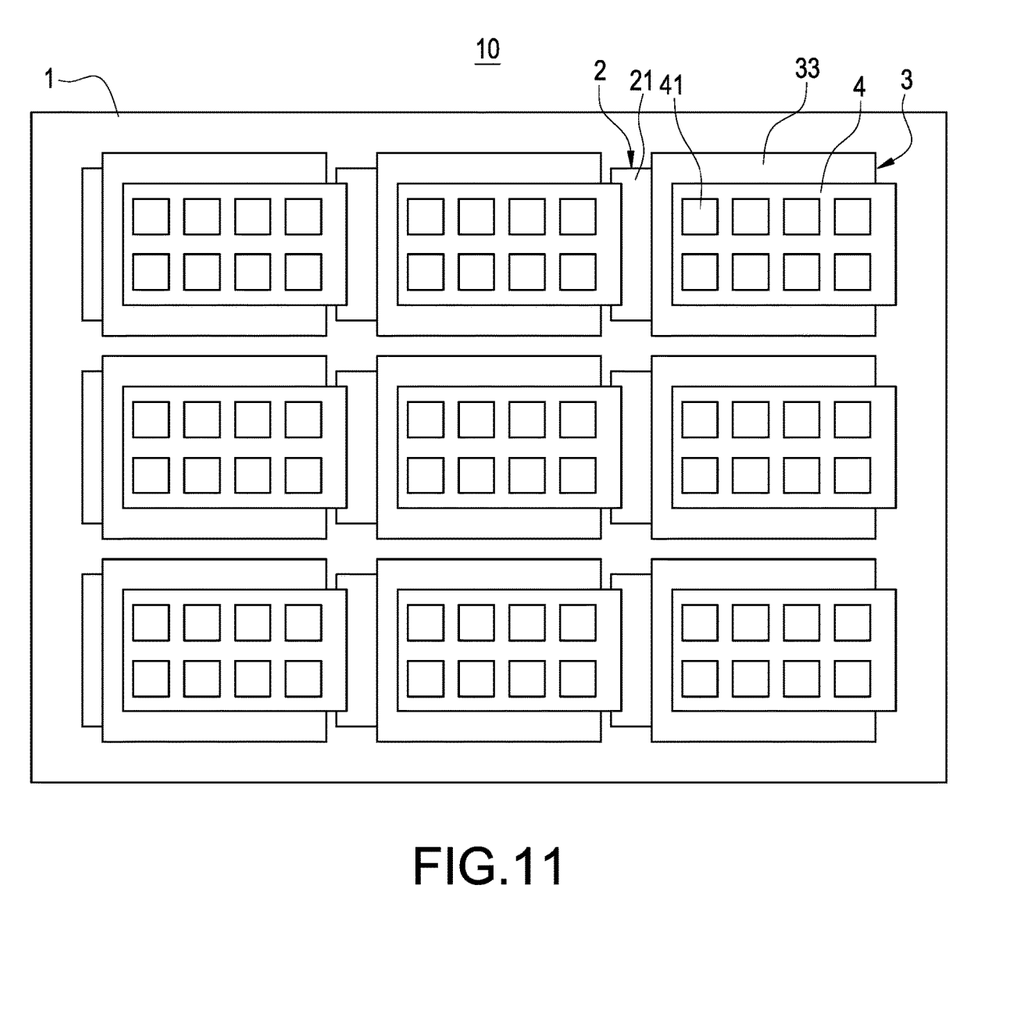
FIG. 11 illustrates a schematic diagram of a structure of photovoltaic cell in accordance with a 2nd embodiment of the present disclosure.

Reference is made to FIG. 11, which illustrates a schematic diagram of a structure of photovoltaic cell in accordance with a 2nd embodiment of the present disclosure. The structure of photovoltaic cell in the 2nd embodiment is similar to the 1st embodiment mentioned above. The difference is that the structure of photovoltaic cell in this embodiment further includes at least one hollowed hole 41 formed on the upper conductive layer 4 of each cell to make sure that the cells are light-transmittable.

Figure 12:
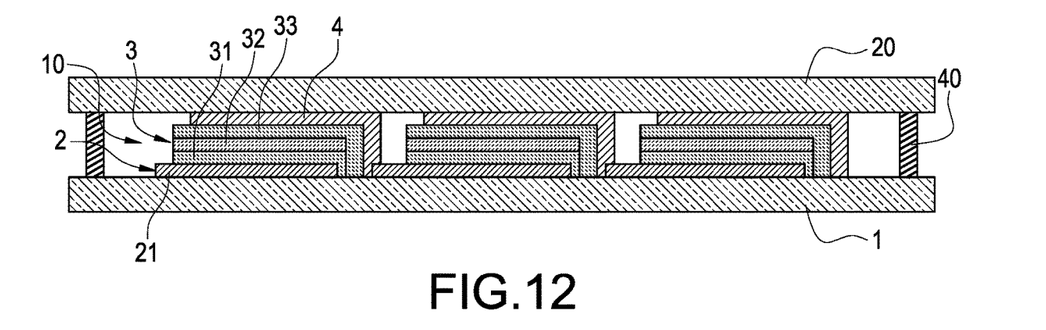
FIG. 12 illustrates a schematic diagram of a structure of photovoltaic cell in accordance with a 3rd embodiment of the present disclosure.

Reference is made to FIG. 12, which illustrates a schematic diagram of a structure of photovoltaic cell in accordance with a 3rd embodiment of the present disclosure. The structure of photovoltaic cell in the 3rd embodiment is similar to the 1st embodiment mentioned above. The difference is that the structure of photovoltaic cell in this embodiment further includes a top cover 20 made of transparent material. An encapsulation 40 is placed between the top cover 20 and the substrate 1 for offering good water and gas barrier capability. The transparent material may be an optical-transparent glass plate or an optical-transparent plastic plate.

Figure 13:
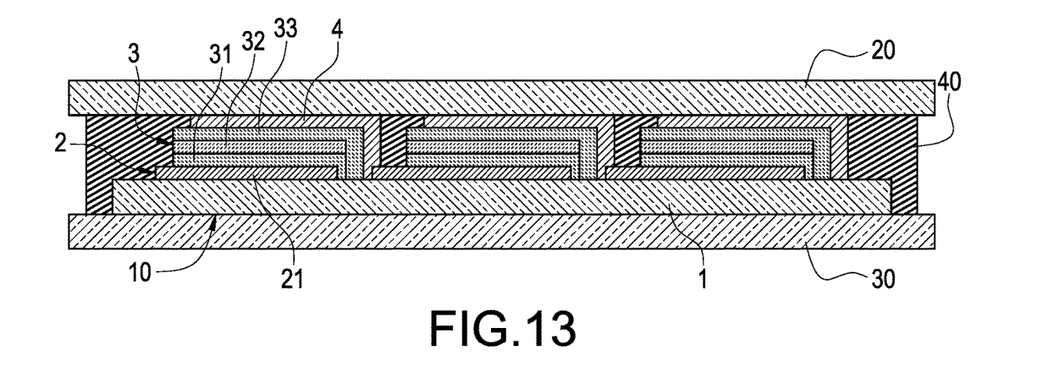
FIG. 13 illustrates a schematic diagram of a structure of photovoltaic cell in accordance with a 4th embodiment of the present disclosure.

Reference is made to FIG. 13, which illustrates a schematic diagram of a structure of photovoltaic cell in accordance with a 4th embodiment of the present disclosure. The structure of photovoltaic cell in the 4th embodiment is similar to the 1st embodiment mentioned above. The difference is that the structure of photovoltaic cell in this embodiment further includes a top cover 20 and a bottom cover 30 made of transparent material. An encapsulation 40 is placed between the top cover 20 and the bottom cover 30 for offering good water and gas barrier capability. The transparent material may be an optical-transparent glass plate or an optical-transparent plastic plate.

Although the present disclosure has been described with reference to the foregoing preferred embodiment, it will be understood that the disclosure is not limited to the details thereof. Various equivalent variations and modifications can still occur to those skilled in this art in view of the teachings of the present disclosure. Thus, all such variations and equivalent modifications are also embraced within the scope of the disclosure as defined in the appended claims.

What is claimed is:

1. A structure of photovoltaic cell, comprising:
   a substrate;
   a lower conductive layer disposed on one side of the substrate;
   a photovoltaic layer disposed at the other surface of the lower conductive layer; and
   an upper conductive layer disposed on the other surface of the photovoltaic layer;
   wherein the photovoltaic layer is constituted by a hole transporting layer, an electron transporting layer, and an active layer sandwiched between the hole transporting layer and the electron transporting layer,
   wherein the hole transporting layer has a first top portion arranged atop the active layer, and a first downward-extending portion extended from the first top portion that is in direct contact with the substrate;
   wherein the upper conductive layer has a second top portion arranged atop the hole transporting layer, and a second downward-extending portion extended from the second top portion that is in direct contact with the substrate; and
   wherein the active layer and the electron transporting layer are separated from the upper conductive layer by the hole transporting layer;
   wherein the active layer is not in contact with the substrate and the lower conductive layer, and the hole transporting layer covers an entire upper surface of the active layer.

2. The structure of photovoltaic cell of claim 1, wherein the substrate is an optical-transparent plastic substrate or an optical-transparent glass substrate.

3. The structure of photovoltaic cell of claim 1, further comprising a hardening layer disposed between the substrate and the lower conductive layer.

4. The structure of photovoltaic cell of claim 1, wherein a thickness of the photovoltaic layer is smaller than 1 μm.

5. The structure of photovoltaic cell of claim 1, wherein the photovoltaic layer is an organic photovoltaic cell comprising a multi-layer structure.

6. The structure of photovoltaic cell of claim 1, wherein the photovoltaic layer is a Perovskite photovoltaic cell comprising a multi-layer structure.

7. The structure of photovoltaic cell of claim 1, further comprising a top cover made of transparent material disposed on the photovoltaic cell and an encapsulation placed between the top cover and the substrate so that the top cover is glued to the substrate.

8. The structure of photovoltaic cell of claim 1, further comprising a top cover disposed on the photovoltaic cell and a bottom cover disposed below the photovoltaic cell, and an encapsulation placed between the top cover and the bottom cover so that the top cover is glued to the bottom cover.

9. The structure of photovoltaic cell of claim 1, wherein the upper conductive layer has at least one hollowed hole.

* * * * *